United States Patent
Wyckoff et al.

(10) Patent No.: US 9,590,368 B2
(45) Date of Patent: Mar. 7, 2017

(54) CHASSIS FOR MODULAR ELECTRONICS ASSEMBLY

(71) Applicant: Deere & Company, Moline, IL (US)

(72) Inventors: Jan M. Wyckoff, Sycamore, OH (US);
Vickie L. Ellis, Milan, IL (US);
Manuel Camacho, Davenport, IA (US)

(73) Assignee: DEERE & COMPANY, Moline, IL (US)

( * ) Notice: Subject to any disclaimer, the term of this patent is extended or adjusted under 35 U.S.C. 154(b) by 0 days.

(21) Appl. No.: 14/731,730

(22) Filed: Jun. 5, 2015

(65) Prior Publication Data

US 2016/0359281 A1 Dec. 8, 2016

(51) Int. Cl.
*H01R 13/73* (2006.01)
*H01R 27/02* (2006.01)

(52) U.S. Cl.
CPC ............ *H01R 13/73* (2013.01); *H01R 27/02* (2013.01)

(58) Field of Classification Search
CPC ...... H01R 13/73; H01R 13/74; H01R 13/741; H01R 13/745; H01R 13/746; H01R 13/748; H01R 12/7005; H01R 27/02; H05K 7/1409; G06F 1/181; G06F 13/409
USPC ........................................................ 211/26
See application file for complete search history.

(56) References Cited

U.S. PATENT DOCUMENTS

| | | |
|---|---|---|
| 2,809,085 A | 10/1957 | Fall |
| 3,092,429 A | 6/1963 | Barnes |
| 4,819,713 A | 4/1989 | Weisman |
| 4,840,570 A * | 6/1989 | Mann, Jr. ............ H01R 12/7005 361/787 |
| 4,888,549 A * | 12/1989 | Wilson ................... G01R 31/28 324/73.1 |
| 4,941,841 A * | 7/1990 | Darden ................... G06F 1/184 361/679.39 |
| 5,136,468 A * | 8/1992 | Wong ...................... G06F 1/184 361/679.6 |
| 5,222,897 A * | 6/1993 | Collins .............. H01R 12/7005 361/801 |
| 5,227,957 A * | 7/1993 | Deters ..................... G06F 1/181 312/223.2 |
| 5,833,337 A | 11/1998 | Kofstad |
| 6,052,278 A * | 4/2000 | Tanzer ................. G11B 33/128 312/223.3 |
| 6,216,339 B1 * | 4/2001 | Rich ..................... H05K 7/1409 29/267 |
| 6,224,177 B1 | 5/2001 | Chu |
| 6,414,851 B2 * | 7/2002 | Cherniski ............... G06F 1/182 174/359 |
| 6,421,252 B1 * | 7/2002 | White .................. H05K 7/1429 174/377 |

(Continued)

*Primary Examiner* — Korie H Chan

(57) ABSTRACT

A platform comprises an array of slots for mounting electronic modules. Side rails are mounted on the platform. A side rail defines at least one outer edge of a slot. A central structure mechanically supports corresponding first electrical connectors for the slots. In a slot, a tray holds an electronic module. The tray comprises a second electrical connector supported at or near an interior end of the tray. The tray is secured laterally by at least one of the side rails. The tray is secured at or near the interior end by the second electrical connector that engages the first electrical connector. The tray is secured at or near an exterior end by an outer fastener associated with a floor of the platform.

17 Claims, 4 Drawing Sheets

(56) References Cited

U.S. PATENT DOCUMENTS

| | | | |
|---|---|---|---|
| 6,854,174 B2* | 2/2005 | Jiang | G06F 1/184 248/682 |
| 6,862,173 B1* | 3/2005 | Konshak | G06F 13/409 361/679.33 |
| 7,172,432 B2* | 2/2007 | Campini | H05K 1/144 361/736 |
| 7,437,186 B2 | 10/2008 | Park | |
| 2012/0309471 A1 | 12/2012 | Luo | |

* cited by examiner

CHASSIS FOR MODULAR ELECTRONICS ASSEMBLY

FIELD OF DISCLOSURE

This disclosure relates to a chassis for a modular electronics assembly.

BACKGROUND ART

In certain prior art, redesign or replacement of an entire electronics assembly can be required if a wireless communications device in the electronics assembly requires revision or replacement. In some circumstances, other hardware in the electronics assembly may not interface with a new or replacement wireless communications device without substantial engineering resources and time. Wireless communications devices can require revision or replacement because of any of the following reasons: (1) different specifications apply to different regions, (2) different wireless service providers use or comply with different communication standards, or (3) different technical requirements apply to different modulation schemes, frequency bands, or wireless services. For example, the frequency bands of radio frequency or microwave communications devices may vary from country-to-country, or different carriers may use time-division, multiple-access (TDMA) systems, Global System for Mobile (GSM) communications, or code-division, multiple-access (CDMA) systems. Further, if terrestrial or cellular coverage is absent or unreliable in certain areas, the wireless communications device may comprise or require a satellite receiver or satellite transceiver.

SUMMARY

In accordance with one embodiment, a chassis for an electronics assembly comprises a platform comprising an array of slots for mounting electronic modules. A plurality of side rails are mounted on the platform. A side rail defines at least one outer edge of a slot. A central structure is adapted for mechanically supporting corresponding first electrical connectors for respective ones of the slots. A tray is adapted for mounting in a corresponding slot and holding an electronic module. The tray has an interior end and an exterior end opposite the interior end. The tray comprises a second electrical connector supported at or near the interior end of the tray. The tray is secured laterally by at least one of the side rails. The tray is secured at or near the interior end by the second electrical connector that engages the first electrical connector. The tray is secured at or near the exterior end by an outer fastener associated with a floor of the platform.

DETAILED DESCRIPTION OF THE PREFERRED EMBODIMENT(S)

Figure 1:
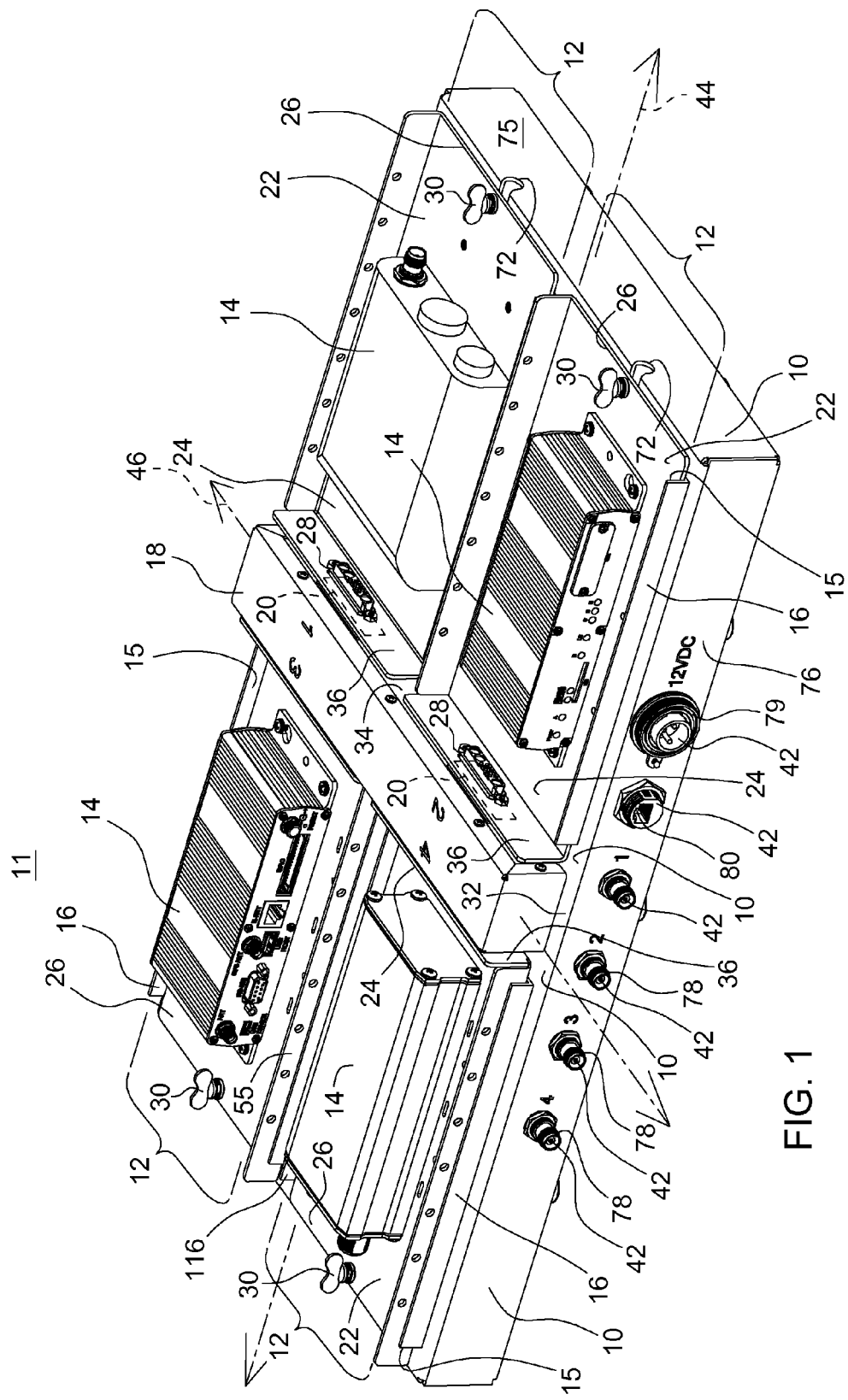
FIG. 1 is a perspective view of a first embodiment of the chassis with electronic modules installed.
Figure 2:
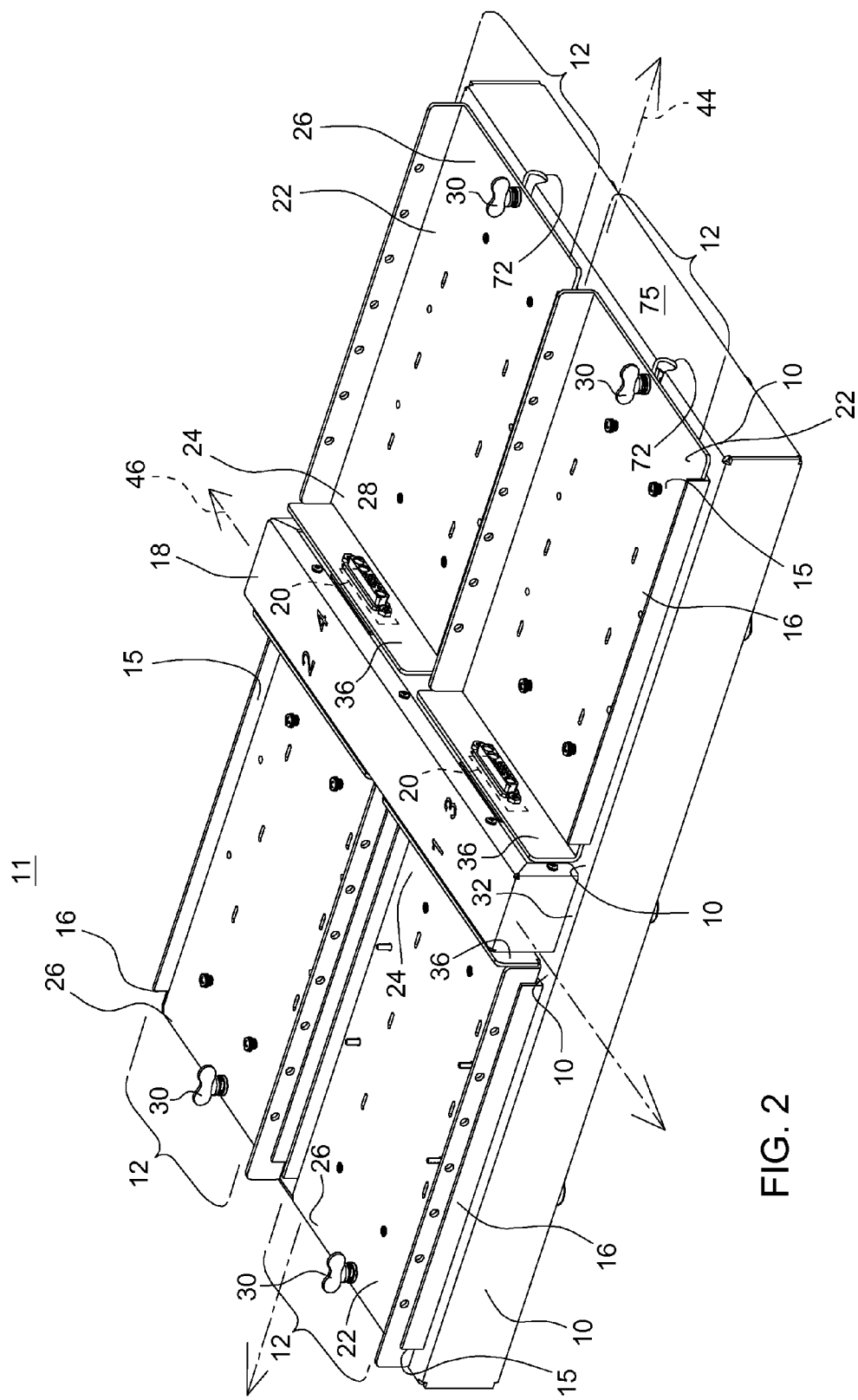
FIG. 2 is a perspective view of a first embodiment of the chassis with electronic modules removed.

In accordance with one embodiment illustrated in FIG. 1 and FIG. 2, a chassis 11 for an electronics assembly comprises a platform 10 comprising an array of slots 12 or bays for mounting electronic modules 14.

A plurality of side rails 16 are mounted on the platform 10 or connected to the platform 10. For example, the side rails 16 can be attached to the platform 10 by fasteners, welding, soldering, brazing, adhesive, snap-fit connections, bendable tabs, or otherwise. In one configuration, a side rail 16 defines at least one outer edge 15 of a slot 12 or bay. In one embodiment, each side rail 16 may have a substantially orthogonal cross-section, or a substantially rectangular cross-sectional channel (e.g., side rail 116). For example, as illustrated in FIG. 1, each outer side rail 16 has a substantially orthogonal cross-section, whereas the inner side rail 116, between two slots 12 or bays, has a substantially rectangular cross-sectional channel.

In FIG. 1 and FIG. 2, a central structure 18 is adapted for mechanically supporting corresponding first electrical connectors 20 (illustrated in dashed lines) for respective ones of the slots 12. In one embodiment, the central structure 18 extends upward from the floor 32 of the platform 10. As illustrated, the central structure 18 is show as a rectangular housing, a polygonal housing that extends above the platform 10, although the central structure 18 could be formed as one or more bulkhead walls extending (e.g., vertically) above the platform 10.

The first electrical connector 20 resides in the central structure 18 or in a central wall 34 extending upward from the floor 32 or at a substantially orthogonal angle to the floor 32. In one embodiment, the central structure 18 comprises at least one first electrical connector 20 for each corresponding bay or slot 12. For example, a first electrical connector 20 is configured to support electrical connections, radio frequency/microwave connections, or both to each electronic module 14 in each slot 12 or bay. As shown in FIG. 1, the first electrical connector 20 (e.g., parallel port) may comprise an electrical connector that is compatible with or the same type, but opposite sex, as the second electrical connector 28 (e.g., parallel port) for engaging, mating, interlocking or connecting with the second electrical connector 28.

In an alternate embodiment, separate first electrical connectors 20 are used for electrical connections at direct current signals, logic level signals, data buses and lower frequency data signals than for radio frequency (RF) signals and microwave signals. Separate RF connectors and microwave connectors can be selected with applicable design impedances (e.g., 50 ohm or 75 ohm), attenuation losses from connectors, and compatibility with coaxial cable or transmission line.

As shown in FIG. 1 and FIG. 2 by way of example without limiting the scope of the appended claims, the first electrical connector 20 comprises a parallel port connector for one or more of the following signals: vehicle data bus signals, controller area network (CAN) bus signals, Ethernet signals, direct current power supply signals, digital logic level signals, or analog sensor signals.

In alternate embodiments, the first electrical connector 20 may comprise serial ports, University Serial Bus (USB) ports, RF signal connectors, or any other type of electrical connector.

A tray 22 is adapted for mounting in a corresponding slot 12 and holding an electronic module 14. A tray 22 may be retained or retained laterally by one or more side rails 16. In a first example, a tray 22 can be retained laterally by an outer side rail 16 and an inner side rail 16. In a second example, a tray 22 can be retained laterally by first outer side rail 16, an adjacent tray 22 (by its lip 55 or its inner wall) and a second side outer side rail 16. As used herein, retained laterally means that the movement of the tray 22 and the electronic module 14 with respect to the platform 10 is impeded in the lateral direction, which is generally parallel or lateral axis 46.

The tray 22 has an interior end 24 and an exterior end 26 opposite the interior end 24 24. The tray 22 comprises a second electrical connector 28 supported at or near the interior end 24 of the tray 22, such as in an interior wall 36 of the tray 22. The tray 22 is secured laterally by at least one of the side rails 16. The tray 22 is secured at or near the interior end 24 by the second electrical connector 28 that engages the first electrical connector 20. The tray 22 is secured at or near the exterior end 26 by an outer fastener 30 associated with a floor 32 of the platform 10. The engaged first electrical connector 20, second electrical connector 28 and outer fastener 30 prevent the tray 22 from moving along the longitudinal axis 44 or parallel to the longitudinal axis 44.

In one configuration, the tray 22 comprises an interior wall 36 extending upward from the tray 22 or at a substantially orthogonal angle with respect to a first surface 38 of the tray 22. For each bay or slot 12, a second electrical connector 28 is aligned in the interior wall 36 for registration with the first electrical connector 20 for a removable mechanical and electrical connection, which supports rapid removal and replacement of any tray 22 and its associated electronic module 14 (e.g., wireless module or transceiver) from the chassis 11.

In an alternate embodiment, for each bay or slot 12 a set of first electrical connectors 20 in the central wall 34 is aligned with a set of second electrical connectors 28 in the interior wall 36 for a removable mechanical and electrical connection. The first electrical connectors 20 and the second electrical connectors 28 may comprise parallel ports, serial ports, USB ports, RF signal connectors, or any other type of electrical connector.

As illustrated in FIG. 1 and FIG. 2 without in any way limiting the appended claims, the second electrical connector 28 can comprise an exposed female connector on an interior side facing the electronic module 14, and pins on the opposite side that mate with a first electrical connector 20 (e.g., female first electrical connector). Cables, wires, coaxial cable and transmission line from each electronic module 14 may be connected to module 14 connector that mates with the exposed second electrical connector 28 (e.g., exposed female connector on an interior side facing the electronic module 14). In any embodiments, the first electrical connector 20 and the second electrical connector 28 may comprise serial ports, USB ports, RF signal connectors, or any other type of electrical connector.

As previously described, the side rails 16 laterally retain the trays 22 and associated electronic modules with respect to a lateral axis 46 of the platform 10 or chassis 11. A longitudinal axis 44 of the platform 10 or chassis 11 is generally perpendicular to the lateral axis 46. The first electrical connector 20 and the second electrical connector 28 may be associated with fasteners or retainers to longitudinally retain a tray 22 or electronic module 14 with respect to the longitudinal axis 44. Similarly, the first electrical connector 20 and the second electrical connector 28 may be associated with outer fasteners 30 to longitudinally retain the tray 22 with respect to the longitudinal axis 44.

As illustrated in FIGS. 1 and 2, the outer fastener 30 comprises a winged fastener that can be hand tightened by hand of a person without tools. However, in an alternate embodiment, the outer fastener 30 may comprise any type of screw, bolt or other suitable mechanical fastener. Below the platform 10, a nut, retainer or other lower fastening member may associated with screw, blot, fastener, or upper fastening member above the platform 10 to retain the tray 22 or electronic module 14. In one embodiment, the outer periphery of the chassis has slot 12 for slidably receiving or removing the outer fastener 30, wherein the slot 72 is in a side wall 75 and floor 32 of the platform 10. The slot 72 may comprise a curved, or rectangular aperture or opening of sufficient size to slidably receive the outer fastener 30, or the upper fastening member and the lower fastening member. Advantageously, the slot 12 allows the lower fastening member, the upper fastening member, or both to slidably be removed or installed when removing or installing tray 22, or its associated electronic module 14, from bay or slot 12 of the chassis 11.

In certain configurations, the platform 10 has a series of external connectors 42 on a bottom side wall 76 with cabling and wiring that communicates to one or more first electrical connectors 20 or second electrical connectors 28. As shown, the external connectors 42 comprise radio frequency connectors 78, a direct current connector 79, and modular jack connector 80. The external connectors 42 provide convenient accessible connections to the electrical inputs and outputs, radio frequency signals and microwave signals, of the electronic modules mounted on the chassis 11.

In one embodiment, the electronic module 14 comprises a radio frequency or microwave communications module 14 or a radio frequency or microwave transceiver, wherein the tray 22 (or the electronic module 14) can be separately removed and replaced independently of other electronic modules or hardware mounted on other trays 22.

Figure 3:
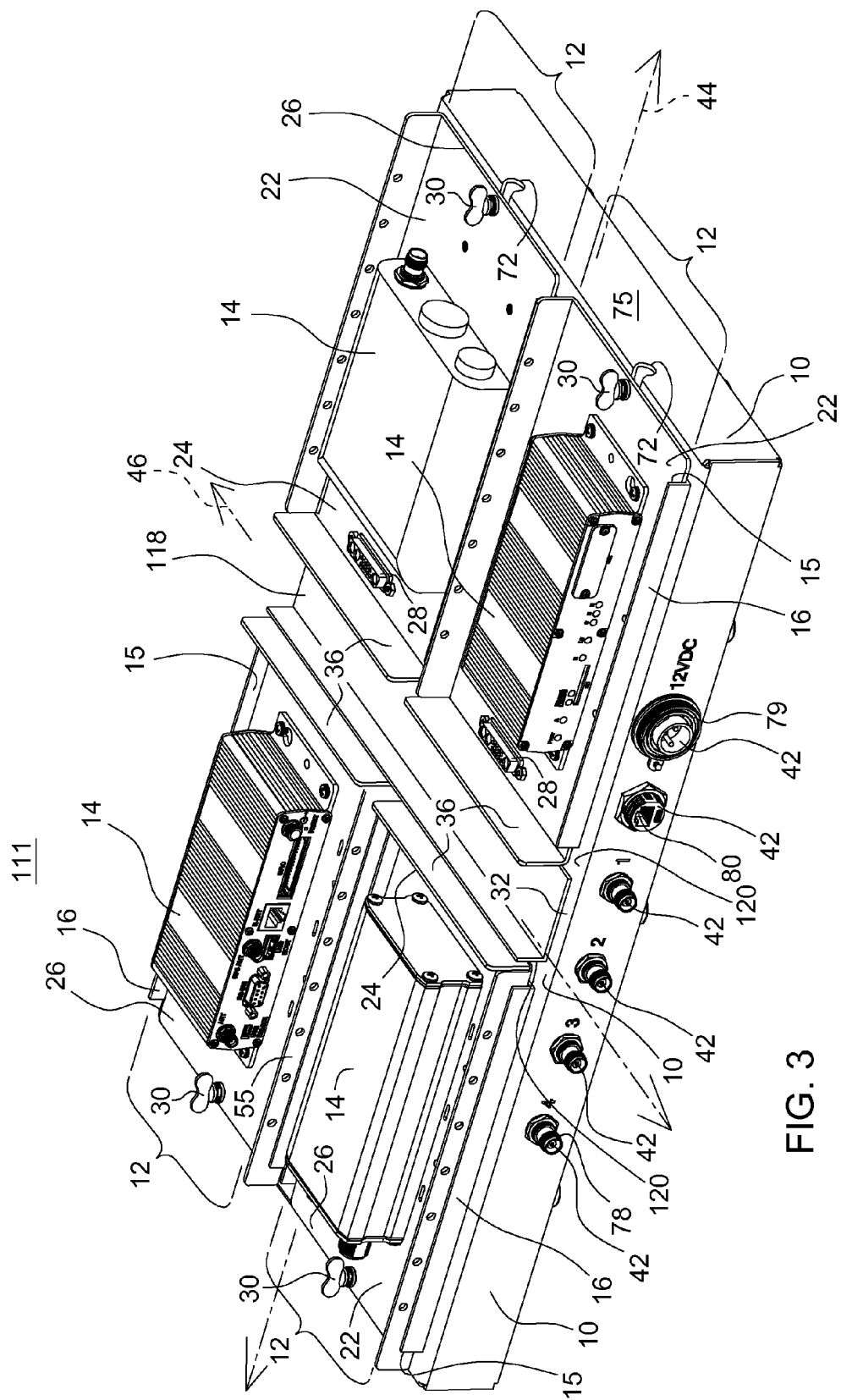
FIG. 3 is a perspective view of a second embodiment of the chassis with electronic modules installed.
Figure 4:
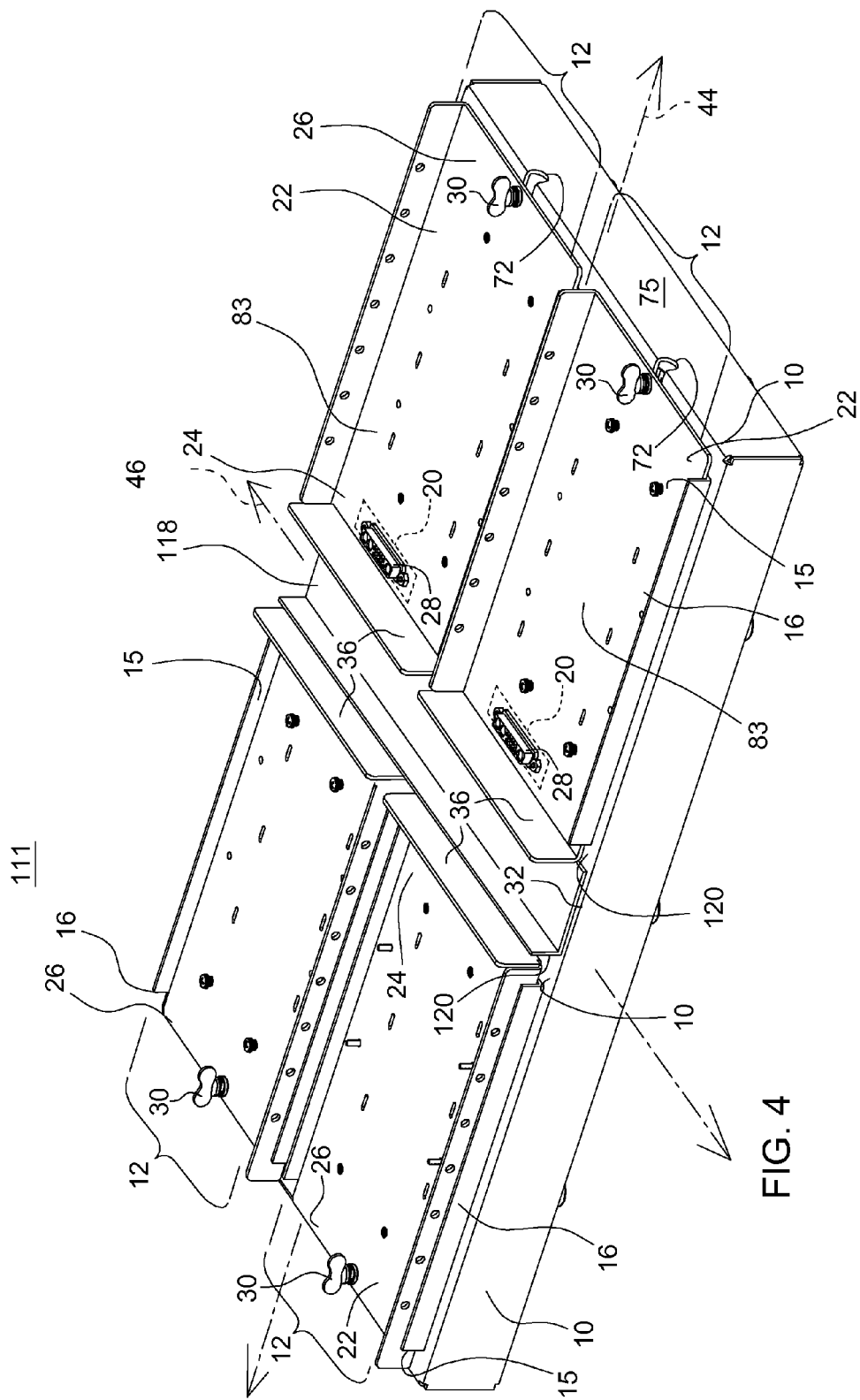
FIG. 4 is a perspective view of a second embodiment of the chassis with electronic modules removed.

The chassis 111 of FIG. 3 and FIG. 4 is similar to the chassis 11 of FIG. 1 and FIG. 2, except the positions of the first electrical connector 20 and the second electrical connector 28 are different. Like reference numbers in FIG. 1 through FIG. 4, inclusive, indicate like elements.

In FIG. 3 and FIG. 4, the central structure 18 is eliminated or replaced by a central rail 118 that arises above the floor 32 of the platform 10 and a central floor region 120 that is generally co-planar to the floor 32. In one embodiment, the central rail 118 may be aligned generally perpendicular to the other rails (16, 116). Further, the first electrical connector 20 resides central floor region 120 or floor 32 of the platform 10 and mates with a corresponding electrical connector that resides in a lower wall 83 or face of the tray 22. In accordance with FIG. 3 and FIG. 4, for each tray 22 or slot 12, the first electrical connector 20 and the second electrical connector 28 are aligned to register and mate with each other for removable installation and disassembly. Further, the first electrical connector 20 and the second electrical connector 28 can longitudinally retain the tray 22 in its corresponding slot 12 or bay, alone or in conjunction with the outer fastener 30.

Having described on or more embodiments, it will become apparent that various modifications can be made without departing from the scope of the invention as defined in the accompanying claims. Further embodiments of the invention may include any combination of features from one or more dependent claims, and such features may be incorporated, collectively or separately, into any independent claim.

The following is claimed:

1. A chassis for an electronics assembly, the chassis comprising:
    a platform comprising an array of slots for mounting electronic modules;

a plurality of side rails mounted on the platform, each of the side rails defining at least one outer edge of one of the slots;

a central structure for mechanically supporting corresponding first electrical connectors for respective ones of the slots; and a tray for mounting in a corresponding one of the slots and holding an electronic module, the tray having an interior end and an exterior end opposite the interior end, the tray comprising a second electrical connector supported at or near the interior end of the tray the tray secured laterally by at least one of the side rails, the tray secured at or near the interior end by the second electrical connector engaging a corresponding one of the first electrical connectors; and the tray secured at or near the exterior end by an outer fastener associated with a floor of the platform; and wherein the central structure comprises a central rail and a central floor region that is generally co-planar to the floor and wherein the first electrical connectors reside in the central floor region.

2. The chassis according to claim 1 wherein the central structure extends upward from the floor of the platform and wherein the first electrical connectors reside in a wall extending upward from the floor or at a substantially orthogonal angle to the floor.

3. The chassis according to claim 2 wherein the tray comprises an interior wall extending upward from the tray or at a substantially orthogonal angle with respect to a first surface of the tray and wherein the second electrical connector is aligned for registration with a corresponding one of the first electrical connectors for a mechanical and electrical connection.

4. The chassis according to claim 1 wherein the electronic module comprises a radio frequency or microwave communications module or a radio frequency or microwave transceiver, wherein the tray can be separately removed and replaced independently of other electronic modules or hardware mounted on other trays.

5. The chassis according to claim 1 wherein the first electrical connector comprises a parallel port connector for one or more of the following signals: vehicle data bus signals, controller area network (CAN) bus signals, Ethernet signals, direct current power supply signals, digital logic level signals, or analog sensor signals.

6. The chassis according to claim 1 wherein the second electrical connector comprises an exposed female connector on an interior side facing the electronic module, and pins on the opposite side that mate with a first electrical connector among the plurality of the first electrical connectors.

7. The chassis according to claim 1 wherein a corresponding one of the first electrical connectors and the second electrical connector can be mechanically connected with one or more fasteners.

8. The chassis according to claim 1 wherein the outer fastener comprises a winged fastener that can be hand tightened by a person without tools.

9. The chassis according to claim 1 wherein the outer periphery of the chassis has slot for slidably receiving or removing the outer fastener, wherein the slot is in a side wall and floor of the platform.

10. The chassis according to claim 1 wherein the platform has a series of external connectors on a bottom side wall with cabling and wiring that communicates to one or more first electrical connectors or second electrical connectors.

11. A chassis for an electronics assembly, the chassis comprising:

a platform comprising an array of slots for mounting electronic modules;

a plurality of side rails mounted on the platform, each of the side rails defining at least one outer edge of one of the slots;

a central structure for mechanically supporting corresponding first electrical connectors for respective ones of the slots; and a tray for mounting in a corresponding one of the slots and holding an electronic module, the tray having an interior end and an exterior end opposite the interior end, the tray comprising a second electrical connector supported at or near the interior end of the tray the tray secured laterally by at least one of the side rails, the tray secured at or near the interior end by the second electrical connector engaging a corresponding one of the first electrical connectors; and the tray secured at or near the exterior end by an outer fastener associated with a floor of the platform; and wherein the outer fastener comprises a winged fastener that can be hand tightened by a person without tools.

12. The chassis according to claim 11 wherein the central structure extends upward from the floor of the platform and wherein the first electrical connectors reside in a wall extending upward from the floor or at a substantially orthogonal angle to the floor.

13. The chassis according to claim 12 wherein the tray comprises an interior wall extending upward from the tray or at a substantially orthogonal angle with respect to a first surface of the tray and wherein the second electrical connector is aligned for registration with a corresponding one of the first electrical connectors for a mechanical and electrical connection.

14. The chassis according to claim 11 wherein the electronic module comprises a radio frequency or microwave communications module or a radio frequency or microwave transceiver, wherein the tray can be separately removed and replaced independently of other electronic modules or hardware mounted on other trays.

15. The chassis according to claim 11 wherein the first electrical connector comprises a parallel port connector for one or more of the following signals: vehicle data bus signals, controller area network (CAN) bus signals, Ethernet signals, direct current power supply signals, digital logic level signals, or analog sensor signals.

16. The chassis according to claim 11 wherein the second electrical connector comprises an exposed female connector on an interior side facing the electronic module, and pins on the opposite side that mate with a first electrical connector among the plurality of first electrical connectors.

17. The chassis according to claim 11 wherein a corresponding one of the first electrical connectors and the second electrical connector can be mechanically connected with one or more fasteners.

* * * * *